United States Patent
Slingerland et al.

(10) Patent No.: US 9,153,414 B2
(45) Date of Patent: Oct. 6, 2015

(54) PARTICLE OPTICAL APPARATUS WITH A PREDETERMINED FINAL VACUUM PRESSURE

(75) Inventors: Hendrik Nicolaas Slingerland, Venlo (NL); William Ralph Knowles, Newbury, MA (US)

(73) Assignee: FEI Company, Hillsboro, OR (US)

( * ) Notice: Subject to any disclaimer, the term of this patent is extended or adjusted under 35 U.S.C. 154(b) by 967 days.

(21) Appl. No.: 11/700,993

(22) Filed: Jan. 31, 2007

(65) Prior Publication Data
US 2007/0176102 A1     Aug. 2, 2007

Related U.S. Application Data

(60) Provisional application No. 60/764,192, filed on Feb. 1, 2006.

(51) Int. Cl.
| | | |
|---|---|---|
| *G01F 23/00* | (2006.01) | |
| *H01J 37/18* | (2006.01) | |
| *H01J 37/301* | (2006.01) | |
| *H01J 37/305* | (2006.01) | |

(52) U.S. Cl.
CPC .............. *H01J 37/18* (2013.01); *H01J 37/301* (2013.01); *H01J 37/3056* (2013.01); *H01J 2237/182* (2013.01); *H01J 2237/2608* (2013.01); *H01J 2237/28* (2013.01)

(58) Field of Classification Search
None
See application file for complete search history.

(56) References Cited

U.S. PATENT DOCUMENTS

| | | | | |
|---|---|---|---|---|
| 3,585,349 | A | * | 6/1971 | Kalbfell .................... 219/121.13 |
| 4,241,259 | A | | 12/1980 | Feuerbaum et al. |
| 4,584,479 | A | * | 4/1986 | Lamattina et al. ........ 250/441.11 |
| 4,698,236 | A | * | 10/1987 | Kellogg et al. ............... 427/526 |
| 4,758,721 | A | * | 7/1988 | Hill ............................... 250/283 |
| 4,818,326 | A | * | 4/1989 | Liu et al. ................... 156/345.36 |
| 5,103,102 | A | * | 4/1992 | Economou et al. ......... 250/492.2 |
| 5,396,067 | A | * | 3/1995 | Suzuki et al. .................. 250/310 |
| 5,573,891 | A | * | 11/1996 | Sato et al. ..................... 430/323 |
| 5,591,970 | A | | 1/1997 | Komano et al. |
| 5,635,245 | A | * | 6/1997 | Kimock et al. ............ 427/249.7 |
| 5,672,816 | A | * | 9/1997 | Park et al. ........................ 73/105 |

(Continued)

FOREIGN PATENT DOCUMENTS

| | | | | |
|---|---|---|---|---|
| DE | 3332248 | | 3/1985 | |
| DE | 3332248 | A1 * | 3/1985 | .............. H01J 37/02 |

(Continued)

OTHER PUBLICATIONS

'Prospekt LEO 1450VPSE,' Jul. 2000, 2 pgs.

(Continued)

*Primary Examiner* — Andrew Smyth
(74) *Attorney, Agent, or Firm* — Scheinberg & Associates, PC; Michael O. Scheinberg

(57) ABSTRACT

The invention relates to a particle-optical apparatus with a predetermined final vacuum pressure. To that end a vacuum chamber of said apparatus is via a first restriction connected to a volume where vapor or gas is present at a known pressure and via a second restriction to a vacuum pump. By making the ratio of the two conductances, associated with said restrictions, a calibrated ratio, the final pressure of the vacuum chamber is a predetermined final pressure. This eliminates the need for e.g. vacuum gauges and control systems, resulting in a more compact design of such apparatus.

19 Claims, 3 Drawing Sheets

(56) References Cited

U.S. PATENT DOCUMENTS

Figure 1:
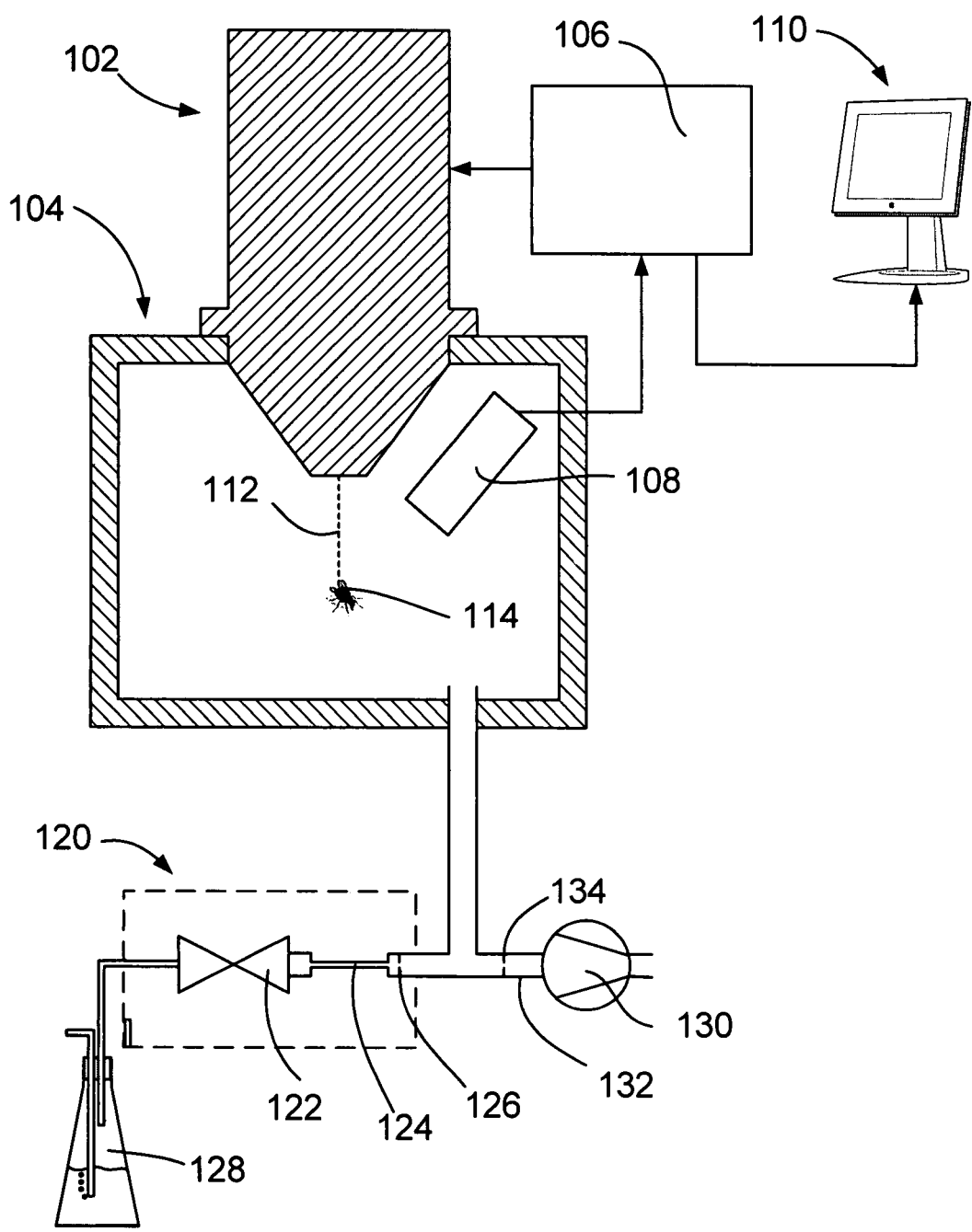

| | | | |
|---|---|---|---|
| 5,869,833 A | 2/1999 | Richardson et al. | |
| 5,997,963 A * | 12/1999 | Davison et al. | 427/582 |
| 6,045,618 A * | 4/2000 | Raoux et al. | 118/715 |
| 6,187,072 B1 * | 2/2001 | Cheung et al. | 422/168 |
| 6,193,802 B1 * | 2/2001 | Pang et al. | 118/715 |
| 6,465,795 B1 * | 10/2002 | Madonado et al. | 250/492.2 |
| 6,517,913 B1 * | 2/2003 | Cheung et al. | 427/588 |
| 6,555,815 B2 * | 4/2003 | Feuerbaum et al. | 850/14 |
| 6,661,005 B1 * | 12/2003 | Bruenger | 250/306 |
| 6,670,608 B1 * | 12/2003 | Taylor et al. | 250/288 |
| 6,872,956 B2 * | 3/2005 | Gnauck et al. | 250/441.11 |
| 6,914,243 B2 * | 7/2005 | Sheehan et al. | 250/288 |
| 6,992,290 B2 * | 1/2006 | Watanabe et al. | 250/310 |
| 7,060,976 B2 * | 6/2006 | Sheehan et al. | 250/288 |
| 7,138,629 B2 * | 11/2006 | Noji et al. | 250/311 |
| 7,351,969 B2 * | 4/2008 | Watanabe et al. | 250/310 |
| 7,449,703 B2 * | 11/2008 | Bykanov | 250/504 R |
| 7,456,413 B2 * | 11/2008 | Buijsse et al. | 250/441.11 |
| 2002/0017619 A1 * | 2/2002 | Hirose et al. | 250/492.3 |
| 2003/0127605 A1 * | 7/2003 | Kondo | 250/492.2 |
| 2004/0169140 A1 * | 9/2004 | Schlichting | 250/310 |
| 2004/0245458 A1 * | 12/2004 | Sheehan et al. | 250/288 |
| 2005/0045821 A1 * | 3/2005 | Noji et al. | 250/311 |
| 2005/0269503 A1 * | 12/2005 | Sheehan et al. | 250/284 |
| 2007/0080291 A1 * | 4/2007 | Buijsse et al. | 250/311 |
| 2009/0200489 A1 | 8/2009 | Tappel et al. | |

FOREIGN PATENT DOCUMENTS

| | | | |
|---|---|---|---|
| DE | 10032607 A1 * | 1/2002 | |
| DE | 10032607 B4 * | 8/2004 | |
| EP | 99112835.6 | 7/1999 | |
| EP | 0969494 | 1/2000 | |
| EP | 969494 A1 * | 1/2000 | G01N 23/225 |
| JP | 03194838 | 8/1991 | |
| JP | 04363849 | 12/1992 | |
| JP | 8138603 | 5/1996 | |
| JP | 08138603 A * | 5/1996 | H01J 37/18 |
| JP | 10134751 | 5/1998 | |
| JP | 10134751 A * | 5/1998 | H01J 37/244 |
| WO | WO 0205310 A1 * | 1/2002 | |
| WO | WO2007143737 | 12/2007 | |
| WO | WO2007145712 | 12/2007 | |

OTHER PUBLICATIONS

'Angebot vom,' May 15, 2001, 5 pgs.
'Lieferschein vom,' Sep. 25, 2001, 4 pgs.
'Abnahmeprotokoll vom,' Nov. 8, 2001, 1 pg.
'Rechnung vom,' Nov. 16, 2001, 2 pgs.
'Seite aus LEO 1400 Series Service Manual Variable Pressure Pumping System,' Jan. 2001, 1 pg.
'Konstruktionszeichnung 347901-9804.000 vom,' Jan. 18, 2001, 1 pg.
'Product Specification LEO 1450VP,' Jul. 2000, 10 pgs.
'Pre-Installation Guide, LEO1400 Service Manual, Seite 14-1,' Jan. 2001, 1 pg.
'Notice of Opposition,' Apr. 19, 2012, 11 pgs.
C. Mathieu, "The Beam-Gas and Signal-Gas Interactions in the Variable Pressure Scanning Electron Microscope", Scanning Microscopy, vol. 13, No. 1, 1999, Chicago, Ilinois.
Cameron, R.E., et al., "Minimizing sample evaporation in the environmental scanning electron microscope," Journal of Microscopy, 1994, pp. 227-237, vol. 173.
Toth, M., et al., "On the role of electron-ion recombination in low-vacuum scanning electron microscopy," Journal of Microscopy, Jan. 2002, pp. 86-95, vol. 205.

* cited by examiner

PARTICLE OPTICAL APPARATUS WITH A PREDETERMINED FINAL VACUUM PRESSURE

This application claims priority from U.S. Provisional Pat. App. 60/764,192, filed Feb. 1, 2006, which is hereby incorporated by reference.

The invention relates to a particle-optical apparatus, comprising
- a vacuum chamber for containing a sample to be examined, said vacuum chamber in working being pumped down to a final pressure by a vacuum pump connected to the vacuum chamber,
- means for the admission of a gas or vapour to the vacuum chamber, the gas or vapour being admitted from a volume with a known pressure,
- where the connection of the vacuum pump to the vacuum chamber represents a first gas conductance, and
- the means for the admission of the gas represent a second gas conductance.

Such a particle-optical apparatus is known from European Patent Application EP 0969494 A1.

Such apparatus are known as e.g. SEMs (Scanning Electron Microscopes) and are used in e.g. the semiconductor industry to inspect and/or analyse samples taken from wafers. In a SEM a beam radiation in the form of a beam of energetic electrons (e.g. 10 keV) is focused on a sample and scanned over it. As a result secondary radiation, such as secondary electrons, back scattered electrons and X-ray radiation, will emerge from the point where the beam impinges the sample. This secondary radiation can be detected by suitable detectors, and thereby give (position dependent) information about the sample.

Such samples can be conductive or insulating, or the sample can comprise insulating parts. Because the sample is irradiated with particles such as high energetic electrons, an insulating sample or insulating parts of a sample can get charged. This charging interferes with the analysis and/or inspection of the sample as it deflects the impinging beam, resulting in erroneous spatial positioning of the beam. Charging will also influence the secondary radiation generated in the sample, e.g. the amount of secondary electrons emitted, thereby changing the amplitude of the signals detected.

When a gas is admitted in the vicinity of the sample, both the impinging beam and the secondary radiation will cause ionization of this gas. The electrons and ions formed by this ionization will neutralize the charge on the sample. This is especially effective when an electric field is applied over the volume where the neutralization gas is present, as this can cause gas multiplication, resulting in an increased number of electrons and ions available for the neutralization of the charge on the sample.

Mentioned EP 0969494A1 discloses a particle-optical apparatus comprising a particle-optical column focusing a beam of particles onto a sample. A gas conduit provides inert gas to the area where the beam impinges on the sample. A differential pumping aperture is placed between the column and the vacuum chamber to enable operation of the apparatus with different vacuum levels in the vacuum chamber and the column. This causes a gas pressure and a pressure gradient near the sample. The known application in one of its embodiments also described a detector which causes an electric field between the sample and the detector, resulting in before mentioned gas multiplication and resultant enhanced neutralization.

The known application mentions at the end of its paragraph [0038] that the vacuum gradient is maintained by balancing the gas flow into the specimen chamber with the amount of gas evacuated from that chamber. The known application also mentions at the end of its paragraph [0037] that a valve can be used for adjusting the pressure used for providing the gas. However, the known application does not disclose how the correct pressure and/or gradient are determined nor does it disclose which criteria are used to adjust the gas flow.

As known to the artisan, the pressure of the admitted gas is important for the contrast obtained from secondary radiation. For this aspect see e.g. the article "On the role of electron-ion recombination in low-vacuum scanning electron microscopy", M. Toth et al., Journal of Microscopy, volume 205 (January 2002), pages 86-95, and more specifically page 90, FIG. 6.

As also known to the artisan, an electron beam travelling through several millimeters of gas at a pressure in excess of e.g. 0.7 mbar (1 torr) results in a scattering of electrons out of the primary beam to such an extend that it considerably enlarges the beam diameter at the point where it impinges on the sample, thereby limiting the resolution of the apparatus. For this aspect see e.g. "The beam-gas and signal-gas interactions in the variable pressure scanning electron microscope", C. Mathieu, Scanning Microscopy volume 13 (1999), number 1, pages 23-41, and more specifically FIG. 6.

It is therefore important to operate at the correct gas pressure, which is the gas pressure where sufficient decharging occurs without the beam diameter being unduly changed.

The regulation of the gas pressure in a chamber is already known and used in e.g. ESEMs (Environmental Scanning Electron Microscopes) by measuring the pressure in a specimen chamber with a vacuum gauge and regulating in a closed loop circuit the amount of admitted gas by adjusting the conductance of a leak valve.

A disadvantage of the apparatus disclosed in mentioned EP0969494A1 is that the measurement and control system is rather bulky, thereby hindering miniaturization of such apparatus.

It is the object of the invention to provide a particle-optical apparatus where at least part of the before mentioned problem is eliminated.

To this end the invention is characterized in that the ratio of the first conductance divided by the second conductance is a calibrated ratio, said ratio calibrated to such a value that the vacuum chamber has a predetermined final pressure.

By calibrating the ratio of the first conductance divided by the second conductance, the gas or vapour pressure will vary (linearly) with the pressure of the volume from which the gas or vapour admitted. In this context 'calibrated' is used as 'pre-adjusted to a predetermined value'. As the pressure of this volume is known, e.g. equaling atmospheric pressure, the pressure in the vacuum chamber is known as well. This eliminates the need for the vacuum gauge, the controlled leak valve and the closed loop circuitry, thereby enabling a less bulky system.

The absolute value of the first conductance (from vacuum chamber to vacuum pump), normally expressed in l/s, and thus also the absolute value of the second conductance (as the ratio is calibrated) determines the time needed to pump down the vacuum chamber.

In an embodiment of the particle-optical apparatus according to the invention the vacuum pump has a final pressure at least 5 times lower than the final pressure of the vacuum chamber.

The final pressure of the vacuum chamber is also determined by the final pressure of the vacuum pump. When the final pressure of the vacuum pump is at least 5 times lower that the pressure of the vacuum chamber, slight changes in the final pressure of the vacuum pump, e.g. caused by temperature changes of fluids used in the pump, have a negligible effect.

In a further embodiment of the particle-optical apparatus according to the invention the vacuum chamber is sealed from atmosphere by a vacuum seal, said seal causing a leakage, and the means for admitting gas or vapour admit an amount of gas or vapour larger than the leakage over the vacuum seal.

Leakage of gas over the vacuum seal can result in a change of pressure in the vacuum chamber. By choosing the first conductance (the conductance from vacuum chamber to vacuum pump) much larger than the conductance of the leak over the vacuum seal, the pressure is predominantly determined by the amount of gas admitted, resulting in only minor influence of the leakage over the seal.

An additional advantage of choosing the second conductance large is that any occurring outgassing of the sample has only negligible effect on the pressure of the vacuum chamber.

In a still further embodiment of the particle-optical apparatus according to the invention the means for admitting gas or vapour admit an amount of gas of vapour at least 5 times larger than the leakage over the seal.

In another embodiment of the particle-optical apparatus according to the invention the predetermined pressure is a predetermined pressure between 0.1 and 50 mbar.

Decharging of the sample occurs for pressures from approximately 0.1 mbar upwards.

Partial pressures between several mbar up to 50 mbar enable the observation of samples in a vacuum without dehydrating the sample in a temperature range of thawing ice to room temperature. This is particularly useful when analysing e.g. biological tissues.

In yet a further embodiment of the particle-optical apparatus according to the invention the pressure of the volume from which gas or vapour is admitted is atmospheric pressure.

In another embodiment of the particle-optical apparatus according to the invention the volume from which the gas or vapour is admitted is connected to the inlet of a vacuum pump.

By pumping down the volume from which the gas or vapour is admitted, it is possible to use e.g. apertures with a diameter of 1 mm, which makes the gas constriction less prone to e.g. clogging than when using apertures with much smaller diameters, as are needed when admitting gas or vapour from atmospheric pressure.

It is remarked that many pumps, e.g. membrane pumps, have well defined final pressures, which is known within a pressure range of e.g. 2 times (meaning that the minimum final pressure and the maximum final pressure achieved with such a pump differ less than a factor 2), and thereby pump down the volume from which the gas or vapour is admitted to a well-known pressure.

It is also remarked that particle-optical apparatus often demand a pressure near a particle emitter of e.g. 10–5 mbar. A multi-stage pumping scheme is often used to achieve this pressure, in which the outlet of a high vacuum pump, such as a multi-stage turbo-molecular pump, is connected to the inlet of a so-called pre-vacuum pump. When using e.g. a membrane pump the pressure at the inlet of the pre-vacuum pump is e.g. 10 mbar.

In a further embodiment of the particle-opticle apparatus according to the invention the volume from which the gas or vapour is admitted is also connected to the outlet of another pump.

By connecting the outlet of a pump, such as the pump used for pumping down the vacuum chamber, to the inlet of the pump pumping down the volume from which the gas or vapour is admitted, a pump used for pumping down the vacuum chamber can be of a type with a final pressure well below the final pressure of the vacuum chamber.

In still a further embodiment of the particle-optical apparatus according to the invention the vapour is water vapour.

The use of water vapour is advantage when observing samples that are otherwise dehydrated in vacuum.

In a yet further embodiment of the particle-optical apparatus according to the invention the gas is air.

In a yet other embodiment of the particle-optical apparatus according to the invention the analysis of the sample comprises the irradiation of the sample with a beam of charged particles.

In a further embodiment of the particle-optical apparatus according to the invention the beam of charged particles is a focussed beam of charged particles.

In another embodiment of the particle-optical apparatus according to the invention the beam of charged particles is a beam of electrons.

By scanning a focused beam of electrons over a sample, an image can be generated of the sample with a much higher resolution than achievable with a light optical microscope.

In still another embodiment of the particle-optical apparatus according to the invention the beam of charged particles is a beam of ions.

As known to the artisan a focused beam of ions causes local sputtering, thereby enabling local modification of a surface irradiated by the ions.

In a further embodiment of the particle-optical apparatus according to the invention the admitted gas comprises a precursor material for the deposition of material. By admitting gas that comprises a precursor material for the deposition of material, local deposition of material can be achieved. Such precursor materials, such as TEOS (Tetraethylorthosilicate, used for $SiO_2$ deposition), $C_{10}H_8$ (used for carbon deposition), $W(CO)_6$ (used for tungsten deposition), are decomposed by the beam of charged particles and thereby form a local deposition on the sample. This technique can be used to e.g. alter semiconductor circuits, by the local deposition of electrically conductive materials.

In another embodiment of the particle-optical apparatus according to the invention the admitted gas is an etching gas.

By admitting an etching gas it is possible to remove the surface of the sample and inspect or analyse layers that where not on the surface previously.

It is remarked that many etching gasses are known to show enhanced etching on surfaces irradiated with e.g. electrons or ions. Examples are e.g. $XeF_2$, $I_2$ or $H_2O$, decomposing into radicals upon irradiation. The radicals thus formed cause local etching. This technique can be used to e.g. alter semiconductor circuits by local removal of electrically conductive materials.

The invention will now be elucidated with figures, where corresponding numbers refer to corresponding features.

FIG. 1 schematically shows a particle-optical apparatus according to the invention where gas is admitted to the vacuum chamber from a volume at atmospheric pressure.

Figure 2:
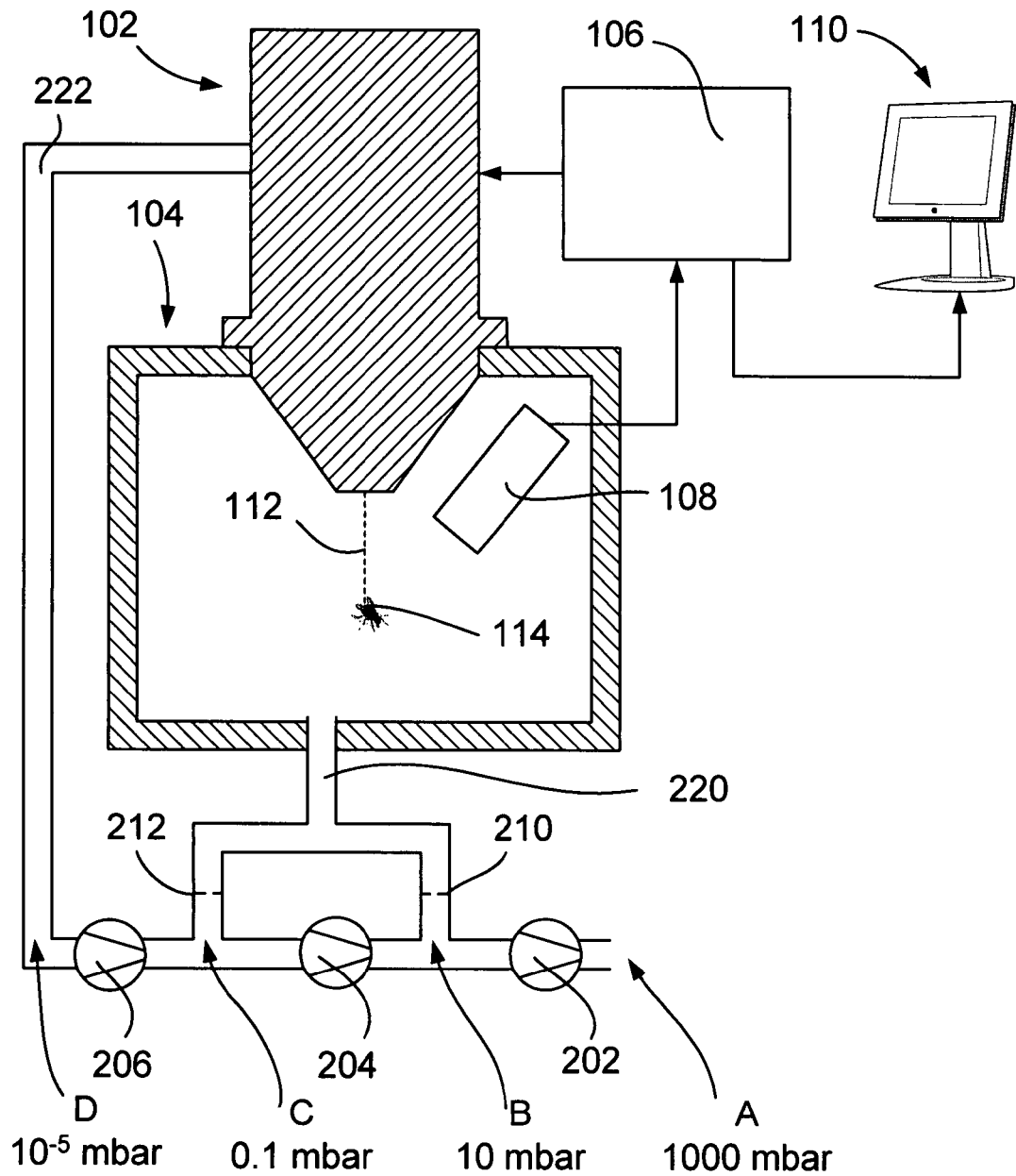

FIG. 2 schematically shows a particle-optical apparatus according to the invention where gas is admitted to the vacuum chamber from a volume at reduced pressure.

Figure 3:
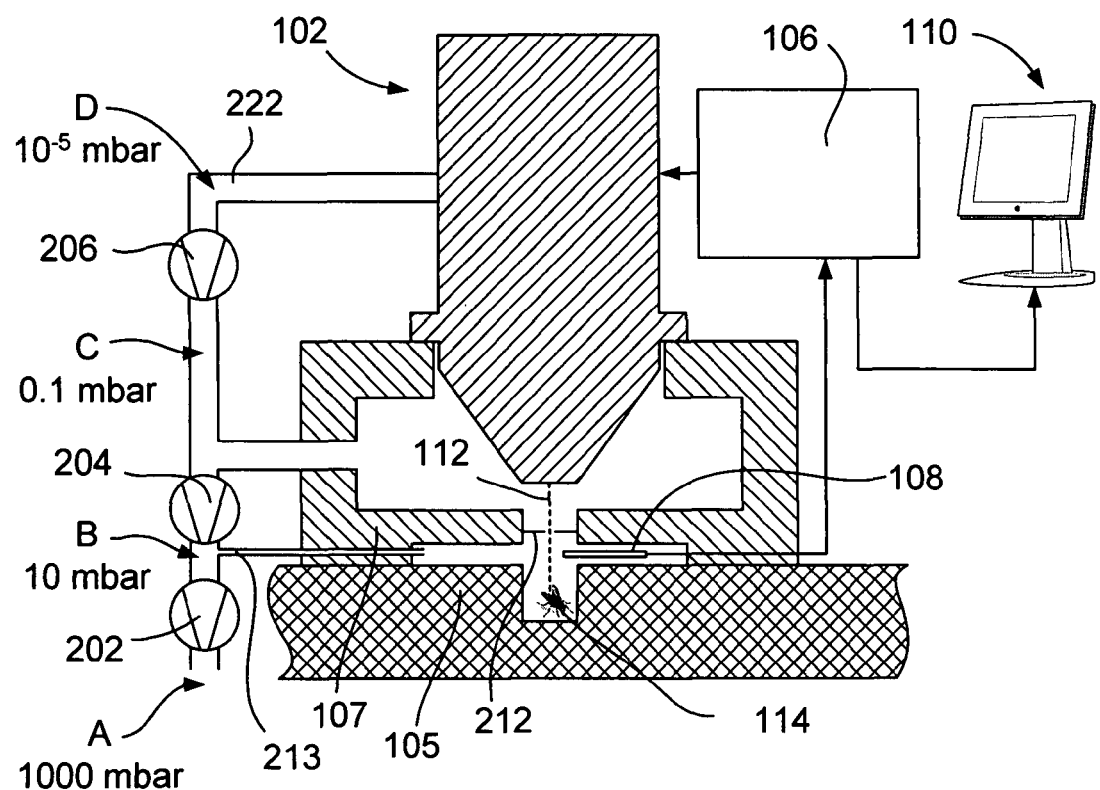

FIG. 3 schematically shows a preferred embodiment of the particle-optical apparatus according to the invention.

FIG. 1 schematically shows a particle-optical apparatus according to the invention where gas is admitted to the vacuum chamber from a volume at atmospheric pressure.

A particle-optical column 102 mounted on a vacuum chamber 104 produces a beam of charged particles in the form of a focused beam of electrons 112. The particle-optical column is evacuated with e.g. a vacuum pump (not shown). A controller 106 controls the column. The electrons are focused in the vicinity of a sample position located in the vacuum chamber, where a sample 114 resides. The controller 106 also controls the scanning of the focused beam over the sample. A detector in the form of a secondary electron detector 108 detects secondary radiation coming from the sample. The signal of the detector 108 is fed to the controller 106, which processes this signal and converts it to a signal for monitor 110, where an image of the sample 114 is displayed. Secondary electron detectors known to the artisan are e.g. back-scattered electron detectors, Everhart-Thornley detectors and Gaseous Secondary Electron Detectors.

The vacuum chamber 104 is connected to a vacuum pump 130 via a hose 132 and a pump restriction 134. The conductance of these pumping means is quantified by a value of $C_1$ l/s.

The vacuum chamber 104 is also connected with means 120 for admitting gas or vapour. The means for admitting a gas or vapour comprise a leak valve 122, a capillary 124, and an aperture 126. The conductance of these admittance means 120 is quantified by a value of $C_2$ l/s. The gas or vapour is admitted by said means 120 from a volume 128 with a known pressure in the form of a volume where a mixture of air and water vapour is present at atmospheric pressure $P_{atm}$.

Assuming that the final pressure of the pump is much lower than the final pressure of the vacuum chamber, the final pressure of the vacuum chamber $P_{cham}$ equals $$P_{cham} = (C_2/C_1) \cdot P_{atm}.$$

The ratio $C_2/C_1$ can be calibrated by e.g. calibrating the conductance of the leak valve, or it can be calibrated by e.g. choosing the proper length of the tubing 124. The calibration can be a factory calibration made during manufactory, or it can be performed at the user site.

Calibration can be performed by temporarily connecting a vacuum gauge to the vacuum chamber 104. This might be simplified by e.g. temporarily removing the particle-optical column 102 from the vacuum chamber and connecting the vacuum gauge via the hole normally occupied by the particle-optical column. As an alternative the calibration can be performed by reproducing the parts governing the conductances $C_1$ and $C_2$ with sufficient accuracy, e.g. by using a capillary with known length and inner diameter as tubing and/or by using apertures with known aperture sizes.

It is remarked that, although the volume from which the gas or vapour is admitted is depicted here as a volume at atmospheric pressure, it is also possible to construct it as a hermetically sealed container with vapour or gas at a known pressure.

FIG. 2 schematically shows a particle-optical apparatus according to the invention where gas is admitted to the vacuum chamber from a volume at reduced pressure. FIG. 2 can be thought to be derived from FIG. 1. The particle-optical column is via vacuum hose 222 pumped by a cascade of pumps 206, 204 and 202. It is remarked that these pumps can be separate pumps, but two or more can be combined into sections of one mechanical pump unit, e.g. pump 202 a separate pre-vacuum pump and pump 204 and 206 two sections of a multi-stage turbo-molecular pump.

Pump 202 pumps gas from volume B towards the environment A, which is at atmospheric pressure. The pressure of volume B is fairly constant, as this is mainly determined by the so-called compression rate or back-streaming of the pump 202 of e.g. 100 times, resulting in a fairly constant pressure of volume B of 10 mbar. Similarly pump 204 pumps gas from volume C to volume B with a compression rate of e.g. 100 times, resulting in a pressure of volume C of 0.1 mbar. Finally pump 206 pumps down the particle-optical column to a working pressure of e.g. $10^{-5}$ mbar.

Gas from volume B will leak through the constriction (aperture) 210 via hose 220 into the vacuum chamber 104, while the vacuum chamber is at the same time pumped via the hose 220 and the constriction (aperture) 212 by pump 204. The ratio of conductance of these constrictions is calibrated to such a value that the final vacuum pressure of the vacuum chamber 104 is the desired pressure of e.g. 0.5 mbar.

It is remarked that the amount pumped from volume C to volume B will hardly influence the pressure of volume B, as this pressure is mainly determined by the final pressure of pump 202. The admitted gas is the gas constituting the final pressure of pump 202.

It is further remarked that by admitting gas or vapour from a volume with a reduced pressure, such as volume B, enables the use of restrictions which are less prone to e.g. clogging than when admitting air from atmospheric pressure. This is due to the fact that a certain leakage, expressed in bar·l/s, is realized with a much higher conductance, expressed in l/s, than when admitting gas or vapour from atmospheric pressure. Such a higher conductance is realized with e.g. larger apertures and/or diameters of capillaries, which are less prone to e.g. clogging.

It is remarked that, although from the above the absolute value of the conductances might seem unimportant, this is not true. For a fast pump-down time it is important that the conductance to the pump is a high conductance. Also, the conductance must be high enough to take case of any leakage into the vacuum chamber. The latter is especially important when using e.g. a slider bearing as a vacuum seal, as this type of seal shows a larger leakage than seals using e.g. elastomers.

As an analogy a voltage divider comprising two resistors can be used: although the divider ratio is only determined by the ratio of the resistors, the effect of time constants (comparable to pump-down time) and leakage currents (comparable to vacuum leakage) is determined by the resistance of both resistors in parallel.

FIG. 3 schematically shows a preferred embodiment of the particle-optical apparatus according to the invention.

FIG. 3 can be thought to be derived from FIG. 2. The vacuum chamber consists of an upper part 107 which can slide over a lower part 105, the parts 107 and 105 together forming a vacuum seal. Such a vacuum seal in the form of a slider bearing is e.g. known from European patent application EP05076474.

The vacuum chamber is pumped by pump 204, via constriction (aperture) 212, through which aperture also the beam of charged particles in the form of a focused beam of electrons 112 enter the vacuum chamber. Gas is admitted through a capillary 213 from volume B, which is connected to a pump 202 in the form of e.g. a membrane pump with a final pressure of e.g. 10 mbar.

It will be clear that numerous modifications and changes may be applied to the embodiments described hereinbefore, without departing from the scope of the invention.

We claim as follows:

1. A particle-optical apparatus, comprising;
    a vacuum chamber for containing a sample to be examined;
    a charged particle beam column for directing the charged particles onto the sample;
    multiple vacuum pumps connected in series,
    a first vacuum path from the inlet of a first one of the multiple vacuum pumps to the vacuum chamber,
    the vacuum path representing a first gas conductance;

a second vacuum path from the outlet of the first one of the multiple vacuum pumps to the vacuum chamber, the vacuum path representing a second gas conductance; and at least one aperture positioned between the first vacuum path and the second vacuum path;

wherein the ratio of the first conductance divided by the second conductance is a calibrated ratio, said ratio calibrated to such a value to provide a predetermined final pressure within the vacuum chamber as the particle-optical apparatus is in operation; and wherein the vacuum chamber has a single vacuum outlet that splits so as to connect to both the first one of the multiple vacuum pumps' inlet and outlet.

2. The particle-optical apparatus of claim 1, in which the vacuum pump provides a vacuum pump final pressure of at least 5 times lower pressure than the predetermined final pressure of the vacuum chamber.

3. The particle-optical apparatus of claim 1, in which the vacuum chamber is sealed from atmosphere by a vacuum seal, said vacuum seal causing an amount of leakage, and the gas inlet path for admitting gas or vapour admit an amount of gas or vapour larger than the amount of leakage over the seal.

4. The particle-optical apparatus of claim 3, in which the second gas conductance for admitting gas or vapour includes a gas inlet path for admitting gas or vapour in an amount at least 5 times larger than the amount of leakage over the seal.

5. The particle-optical apparatus of claim 1, in which the first conductance and the second conductance are calibrated to provide a predetermined final pressure between 0.1 and 50 mbar.

6. The particle-optical apparatus of claim 1, in which the pressure of the volume from which the gas or vapour is admitted is atmospheric pressure.

7. The particle-optical apparatus of claim 1, in which the volume from which the gas or vapour is admitted is connected to an inlet of a vacuum pump.

8. The particle-optical apparatus of claim 7, in which the volume from which the gas or vapour is admitted is also connected to the outlet of another pump.

9. The particle-optical apparatus of claim 1, in which the vapour is water vapour.

10. The particle-optical apparatus of claim 1, in which the gas is air.

11. The particle-optical apparatus of claim 1, in which the analysis of the sample comprises the irradiation of the sample with a beam of charged particles.

12. The particle-optical apparatus of claim 11, in which the beam of charged particles is a focused beam of charged particles.

13. The particle-optical apparatus of claim 11, in which the beam of charged particles is a beam of electrons.

14. The particle-optical apparatus of claim 11, in which the beam of charged particles is a beam of ions.

15. The particle-optical apparatus of claim 11, in which the admitted gas comprises a precursor material for the deposition of material.

16. The particle-optical apparatus of claim 11, in which the admitted gas comprises an etching gas.

17. A method of providing a predetermined pressure in a vacuum chamber of a charged particle beam system, comprising:

providing a single gas pathway leading from the vacuum chamber, the gas pathway splitting into a vacuum path and an inlet path, the vacuum path being connected to the intake of one of multiple vacuum pumps in series, the inlet path being connected to the output of the one of multiple vacuum pumps in series, at least one aperture being positioned between the vacuum path and the inlet path;

removing gas or vapour from the vacuum chamber through the vacuum path to the intake of the first of multiple vacuum pumps in series, the vacuum path representing a first gas conductance;

admitting a gas or vapour to the vacuum chamber through the inlet path, the inlet path having a second conductance; and directing a charged particle beam toward a work piece in the sample chamber;

wherein the quotient of the first conductance divided by the second conductance being a predetermined calibrated ratio, said predetermined ratio calibrated to such a value that the vacuum chamber has a predetermined final pressure without requiring monitoring with a vacuum gauge, the first and second conductances being through constricting openings of known sizes through which the gas or vapour flows, and wherein the predetermined calibrated pressure is between 0.1 and 50 mbar that is capable of decharging the sample.

18. The method of claim 17, in which the vacuum pump has a final pressure at least 5 times lower than the final pressure of the vacuum chamber.

19. The method of claim 17, in which the vacuum chamber is sealed from atmosphere by a vacuum seal, said vacuum seal causing a leakage, and the inlet path admits an amount of gas or vapour larger than the leakage over the seal.

* * * * *